(12) United States Patent
Chordia et al.

(10) Patent No.: US 7,140,197 B2
(45) Date of Patent: Nov. 28, 2006

(54) MEANS AND APPARATUS FOR MICROREFRIGERATION

(76) Inventors: Lalit Chordia, 153 Shadow Ridge Dr., Pittsburgh, PA (US) 15238; Brian Moyer, 2220 Carey Way, Pittsburgh, PA (US) 15203; John C Davis, 9 Rodgers Dr., Pittsburgh, PA (US) 15238

( * ) Notice: Subject to any disclaimer, the term of this patent is extended or adjusted under 35 U.S.C. 154(b) by 174 days.

(21) Appl. No.: 10/373,360

(22) Filed: Feb. 24, 2003

(65) Prior Publication Data

US 2003/0221446 A1    Dec. 4, 2003

Related U.S. Application Data

(60) Provisional application No. 60/359,032, filed on Feb. 22, 2002.

(51) Int. Cl.
*F25D 9/00*    (2006.01)
(52) U.S. Cl. .................... 62/401; 165/104.33; 361/700
(58) Field of Classification Search .................. 62/401, 62/402, 403, 498, 259.2, 512, 434, 500, 407; 361/700, 688; 165/104.33
See application file for complete search history.

(56) References Cited

U.S. PATENT DOCUMENTS

| | | | |
|---|---|---|---|
| 5,405,533 A | * | 4/1995 | Hazlebeck et al. ......... 210/634 |
| 5,524,442 A | * | 6/1996 | Bergman et al. ............... 62/86 |
| 5,653,285 A | | 8/1997 | Lee |
| 5,655,378 A | * | 8/1997 | Pettersen ...................... 62/174 |
| 6,055,154 A | * | 4/2000 | Azar ........................... 361/688 |
| 6,148,635 A | | 11/2000 | Beebe et al. |
| 6,310,773 B1 | | 10/2001 | Yusuf et al. |
| 6,400,012 B1 | | 6/2002 | Miller et al. |
| 6,407,916 B1 | | 6/2002 | Konstad |
| 6,434,955 B1 | | 8/2002 | Ng et al. |
| 6,438,984 B1 | | 8/2002 | Novotny et al. |
| 6,457,515 B1 | | 10/2002 | Vafai et al. |
| 6,497,110 B1 | | 12/2002 | Davidson et al. |
| 6,498,725 B1 | | 12/2002 | Cole et al. |
| 6,502,419 B1 | | 1/2003 | Pfister et al. |
| 6,598,409 B1 | * | 7/2003 | Shyy et al. ................... 62/115 |
| 6,644,045 B1 | * | 11/2003 | Tang et al. ................... 62/116 |
| 6,644,062 B1 | * | 11/2003 | Hays ........................... 62/402 |

FOREIGN PATENT DOCUMENTS

NO    0 424 474 B2 * 11/1997

\* cited by examiner

*Primary Examiner*—Mohammad M. Ali
(74) *Attorney, Agent, or Firm*—Meyer, Unkovic & Scott, LLP; David G. Oberdick, Esq; Christian M. Best, Esq (57) ABSTRACT

An integrated, self-contained microrefrigeration apparatus, in a dimension small enough to fit inside small appliances, such as electronic cases and portable equipment is described. The microrefrigerator employs a working fluid that circulates between evaporator, compressor, condenser and turbine-expander components in a closed loop. Two configurations are claimed: one with the compressor and turbine operating on independent shafts, and the other with the turbine and compressor both operating on the motor shaft.

51 Claims, 6 Drawing Sheets

Fig 1. Components for Vapor Compression Transcritical Cycle with Turbine

Fig. 2. Integrated, non-distributed Microrefrigerator with Uncoupled Turbine

Fig. 3. Compressor head detail

Fig. 4 End view showing compressor head array and eccentric rotor

Fig. 5 Axial orientation of microrefrigerator components, side view

Fig. 6 Present invention with coupled turbine-compressor

MEANS AND APPARATUS FOR MICROREFRIGERATION

CROSS-REFERENCE TO RELATED APPLICATION:

This application claims priority to U.S. Provisional patent application Ser. No. 60/359,032 filed Feb. 22, 2002, teachings of which are incorporated herein by reference.

BACKGROUND OF THE INVENTION

1. Field of the Invention

This invention relates to refrigeration devices and methods that employ a supercritical fluid in a vapor-compression thermodynamic cycle, and more particularly to a small-scale apparatus needed to operate such a cycle. Typical applications include cooling of electrical, electronic, optical and portable devices.

2. Background

Small-scale refrigerators, also referred to as microrefrigerators, are under development for the purpose of cooling such devices as computers, servers, telecommunications switchgear and numerous other types of electronic equipment, as well as portable coolers, medical equipment and many more items that are generally compact in design, if not portable in practice. Until recently, these types of equipment have been cooled by such simple devices as fans and non-mechanical heat spreaders. The need for increased performance of such devices, together with ever increasing compactness, has led to greatly increased levels of heat dissipation from these devices, with the consequence that the conventional forms of cooling are in many cases unable to prevent device temperatures from rising too high, causing the devices to fail. Furthermore, the goat of some device designers is not merely to prevent harmful temperature rises but to facilitate performance-enhancing temperature decreases. For example, electronic equipment can run faster and can be more reliable if cooled sufficiently. Thus, a need exists not only for small-scale equipment that can cool devices to safe operating temperatures, but also to refrigerate devices further to temperatures that enhance performance.

Much effort has been devoted to improving the cooling of electronic components with forced air. Because space and cost considerations limit the size of fans that can be employed, greater attention is devoted to the heat sink that withdraws heat from a hot component by conduction, whereupon a fan cools it by forced convection. Lee (U.S. Pat. No. 5,653,285) provides a recent example of this, in which the heat sink is configured for maximum heat transfer efficiency. Another popular method of improving the heat sink is to construct it as a thermoelectric cooler, known as a Peltier cooler, which enables the temperature of the heat sink at the junction with the heat source to be substantially below the temperature of the heat source. Pettier coolers have the disadvantage of requiring more input power than can be dissipated and are therefore inefficient means of microrefrigeration.

There are many more such examples of heat-sink configuration. More recently, inventions have been revealed that employ a cooling fluid inside the heat sink. Miller et al. (U.S. Pat. No. 6,400,012) describe a heat sink with channels for the circulation of a coolant, the configuration of which is designed to reduce the thermal resistance between the heat generating device and the cooling medium within the heat sink. However, no specific cooling medium is provided. Cole et at. (U.S. Pat. No. 6,478,725) takes this concept a step further by providing a means by which a coolant comes in direct contact with the heat generating device, within a seated container, as an atomized spray, which then condenses and is drawn out of the container for circulation to another device for cooling, before returning to the sealed chamber to repeat the cycle. Such close proximity between coolant and microchip could in the long run disable the microchip.

More commonly, attention has been focused on indirect cooling in a small-scale heat exchanger of the type developed by Miller et al. Vafai et al. (U.S. Pat. No. 6,457,515) describe a two-layer microchannel structure. The cooling fluid is circulated through remote heat exchangers and other equipment in a distributed manner. In such distributed systems, the components of the system are separate and not enclosed in the same container. Konstad (U.S. Pat. No. 6,407,916) describe a more compact means of distributed heat removal, calling for a heat pipe to conduct a coolant back and forth between a heat sink and an air-cooled heat exchanger.

Refrigeration, as opposed to cooling, increases the complexity of design, especially if enclosing all components of the refrigeration cycle in a single container. Davidson et al. (U.S. Pat. No. 6,497,110) demonstrate this in a device that completely isolates the electronic components from surrounding devices, in part to prevent moisture condensation on said surrounding devices. A disadvantage is that wire connections for signal transmission to and from the electronic components are discouraged and are instead substituted by optical connections in the preferred version of that invention.

Current systems for refrigerating electronic equipment are bulky and can add to the overall size of the electronic appliance. Examples of such systems are disclosed by Porter (U.S. Pat. No. 5,574,627), Wall et al. (U.S. Pat. No. 6,054,676), and Eriksen et al. (WO 0125881 A2). The challenge in today's environment is to miniaturize such refrigeration systems so as to fit into existing appliance architecture, including laptop computers.

For reasons of compactness and efficacy, the working fluid employed in microrefrigeration devices with internal working fluid circulation, must be efficient in a thermodynamic sense. A thermodynamically efficient working fluid transfers heat readily with minimum requirement for work. For reasons of safety, the working fluid must also be nontoxic and environmentally benign. Performance demands such as this, lead us to consider transcritical carbon dioxide as the working fluid.

In conventional vapor-compression refrigeration cycles, heat is absorbed at constant temperature by a fluid undergoing evaporation, vapor is then compressed to a higher pressure before giving up heat of evaporation, as well as work energy added during compression, in a condenser at subcritical pressure, before ultimately decompressing through an expander and returning to the evaporator to pick up heat and begin the cycle anew. An alternative to this cycle is to compress the fluid to a supercritical state at a high enough pressure to ensure that it remains in a supercritical state as it releases heat to a cooling medium. In refrigeration cycles, the cooling medium is usually air, but it can be another fluid, such as seawater.

Then, as the cooled working fluid is expanded, it returns to a subcritical state and condenses, after which it returns to the evaporator to absorb heat anew. Such a cycle is termed transcritical.

Throughout the history of vapor-compression refrigeration, subcritical cycles have been the norm. Chlorofluorocarbon (CFC) working fluids operating on such cycles became popular in the 1930s. These fluids were deemed non-toxic and safe. By the early 1970s, however, the environmental risks posed by CFCs, particularly to the atmosphere's ozone layer, were realized. This has led to renewed interest in carbon dioxide, which can be operated in fully subcritical cycles, or in a transcritical cycle for better efficiency.

OBJECTS OF THIS INVENTION

It is therefore an object of this invention to provide improvements in the way small-scale refrigeration devices are designed and operated so as to make them work more efficiently and thereby to provide sufficient cooling capacity in a volume of space, small enough to allow such refrigeration devices to be incorporated within, or as part of, the enclosure of an electronic or other small-scale appliance.

Another object of the present invention is to assemble the refrigeration device in an integrated package that can be incorporated within electronic or other small-scale appliances.

Another object of the present invention is to derive power to operate the refrigeration device from the same public power source that drives the electronic or other small-scale appliance, without requiring more power than that which is dissipated in the process of refrigeration.

Another object of this invention is to provide refrigeration capacity that is sufficient to extend the operating life of electronic components, or to increase the speed of operation of said components, over that which would be expected with conventional non-refrigeration means.

Yet another object of this invention is to achieve the aforementioned goals using a nontoxic and environmentally benign working fluid.

SUMMARY OF THE INVENTION

This invention relates to an apparatus for microrefrigeration using a vapor compression cycle. The apparatus includes:
  (a) a natural and environmentally benign working fluid in a transcritical cycle;
  (b) a compressor means to compress the working fluid;
  (c) at least one heat exchanger for transferring heat from the working fluid to an external environment;
  (d) at least one exchanger for transferring heat from a target device to the working fluid;
  (e) a throttling means to expand working fluid;
  (f) a closed loop connecting said compressor, said heat exchangers and said throttling means for circulation of the working fluid in a transcritical cycle;
  (g) components (a) through (e) in a single container; and
  (h) the said container having contact with the said target device This invention further relates to the apparatus as recited above, wherein the natural and environmentally benign working fluid is at least one selected from a group consisting of carbon dioxide, water, and natural hydrocarbon.

In the apparatus as recited, the compressor is of reciprocating type or centrifugal type and operates at low voltage. At least one heat exchanger of the apparatus is of a microchannel type. Furthermore, the microchannels of said apparatus may be of ovoid or polygonal cross-sectional shape.

The turbine in the apparatus as cited is positioned between two heat exchangers. It may be of an impulse or reaction type. The turbine throttles flow between the heat exchangers and produces useful work in the process of throttling. Said turbine may be energetically coupled to the compressor to recover energy.

The apparatus as recited provides increased cooling capacity and increased energy efficiency over cycles operating with throttling valves.

Further aspects of the apparatus as recited is that it operates with a natural and environmentally benign working fluid that is oil-free. The said container does not exceed 10 $cm^3$/watt of microrefrigeration for said container consuming 100 watts or lower. The apparatus may additionally include: one or more intercoolers to transfer useful work from the high pressure side to the low pressure side; one or more separators to separate gas from liquid; an ejector for throttling, wherein the said ejector is between heat exchangers. Said entercoolers, separators and ejector increase the efficiency of the cycle.

In the apparatus as recited, the compressor means, throttle control means, motor, or a combination thereof are regulated by a regulating means. Sensors monitor and control temperature and temperature-related phenomena. The apparatus derives power from a target device's public power network or the apparatus derives power from an independent source. Insulation avoids external condensation on the apparatus and it avoids external condensation on the target device.

In the apparatus as recited, one or more of the heat exchangers may be external. Said heat exchangers transfer heat from the target device to the working fluid and are included in the closed loop. An external heat exchanger may be inserted into a packaging of components of the target device and be in contact with components of the target device, including direct contact with components of the target device.

A method for microrefrigeration using a vapor compression cycle with:
  a. obtaining a natural and environmentally benign working fluid;
  b. compressing the said working fluid;
  c. transferring heat from the working fluid to an external environment through one or more heat exchangers;
  d. expanding the said working fluid;
  e. transferring heat from another external environment to the working fluid through one or more heat exchangers;
  f. connecting the above mentioned components in a closed loop;
  g. circulating said refrigerant in said loop through a cycle involving supercritical high pressure and subcritical low pressure conditions;
  h. refrigerating the external environment (e).

wherein, the method of microrefrigeration is made possible by the aforementioned apparatus in accordance with the performance characteristics of the apparatus of this invention.

BRIEF DESCRIPTION OF THE DRAWINGS

A detailed description of the invention follows with reference to the following drawings.

DETAILED DESCRIPTION OF THE INVENTION

DEFINITIONS

"Centrifugal type" means
Having an rotating element producing centrifugal force

"Compression stroke" means
The length or dimension of the movement of the mechanical element in the compressor "Compressor" means
A device to increase the pressure of a fluid using mechanical, electrical, or magnetic means, or a combination thereof, in one or more stages.

"Condenser" means
A device for transferring heat from the working fluid to an external environment.

"Energetically coupled" means
Having energy transferred from one element to another element "Evaporation" means
The process of adding heat from an external environment to the closed circuit loop "Final compression volume" means
The fraction of the starting volume that is occupied by the working fluid after compression "Impulse type" means
A turbine consisting of a set of blades mounted on a rotor toward which a nozzle directs a fluid, causing the rotor to turn "Intercooler" means
Exchanging heat between two elements within the cycle where the element that needs to be cooled transfers the heat to the element that need to be heated "Isentropic expansion" means
Expanding the fluid to a lower pressure while keeping the entropy as close to constant as possible "Low voltage" means
No more than 120 volts of direct or alternating current "Micro size" means
Small enough to fit within the casing of a target device "Microchannel" means
Having a height or diameter less than 2,000 micrometers "Microrefrigeration" means
Refrigeration performed with equipment of micro size "Microrefrigerator" means
A container that includes all the components of microrefrigeration cycle except for sensory, control or power connections "Natural oil-free working fluid" means
Naturally occurring working fluid having no contact with lubricating oil at any point in the cycle "Reaction type" means
A turbine consisting of a set of moving blades mounted on a rotor as well as a set of blades fixed on a non-moving stator, both sets of which act as nozzles that drive the fluid against the moving blades, causing the rotor to turn "Reciprocating type" means
Having an element producing periodic pressure fluctuations "Separator" means
A device for the separation of vapor and liquid in the closed loop "Subcritical" means
A condition of the working fluid where the pressure and temperature are below the working fluid's critical pressure and temperature respectively.

"Supercritical" means
A condition of the working fluid where the pressure and temperature are above the working fluid's critical pressure and temperature respectively "Target device" means
An electrical, electronic, optical or portable appliance with at least an integrated circuit or embedded control that generates heat including computers, servers, telecommunications switchgear and numerous other types of electronic equipment, as well as portable coolers, medical equipment and many more items that are generally compact in design, if not portable in practice "Transcritical cycle" means
A cycle that includes supercritical and subcritical conditions of the refrigerant "Useful heat" means
The heat that reduces the demand for external energy "Working fluid" means
The material undergoing vapor compression, also referred to as the working fluid

DESCRIPTION

The objects of this invention are achieved by implementing equipment that circulates a working fluid in a closed loop, impelling said liquid by compression such that the fluid is compressed to a supercritical state, said state being maintained as the fluid then passes through a heat exchanger for purposes of exhausting heat to an external medium, such as air or water, whereupon the working fluid is expanded and returned to the sub-critical pressure that existed prior to compression, whereupon the fluid condenses and drops to a temperature suitable for its use in absorbing heat in an evaporator. The equipment needed to accomplish this task are integrated and incorporated within, or as part of, an appliance enclosure.

The components for said equipment include: (1) a heat exchanger with microchannels for conducting working fluid, said heat exchanger positioned in close proximity, and preferably direct contact, with the heat-generating device that is to be cooled; (2) a compressor to force the working fluid to a supercritical state while at the same time propelling the fluid throughout the closed loop of components; (3) a heat exchanger to remove heat from the working fluid in exchange with an ambient fluid, typically air or water; (4) and expansion device to return the working fluid to a subcritical state, said expansion device being any of a throttling valve, turbine or ejector; (5) one or more means of conducting the working fluid between the aforementioned components. Said components are integrated in a single enclosed package with the provision of external leads for control and power.

The working fluid that circulates through the integrated components is nontoxic and environmentally benign. In a preferred embodiment of this invention, the working fluid is carbon dioxide. In a further preferred embodiment of this invention, the components are built and assembled in such a way as to permit the use of carbon dioxide working fluid in a transcritical cycle.

The present invention provides a novel method and apparatus for refrigeration. The refrigerating method herein relates to a vapor compression cycle and apparatus. The system is comprised of at least a compressor, two or more heat exchangers, a motor and a component for throttling and control thereof, all connected within a closed circuit and integrated into one micro-package. The apparatus provides a means for cooling target devices, including, but not limited to, electrical and electronic devices, preferably of micro-size, and other devices and components having at least an integrated circuit or embedded control. Examples of target devices include most devices that employ an integrated circuit, such as computers of all types, computer components, analytical and laboratory equipments, lasers, remote sensing equipment and radio frequency and microwave devices.

The microrefrigeration apparatus exploits the advantages of a nontoxic and environmentally benign working fluid that enables a reduction in size of said components and overall size of said apparatus. The working fluid is preferably carbon dioxide, water, air or a hydrocarbon. A turbine, or other method of throttling, may be incorporated to increase cooling capacity and energy efficiency.

Figure 1:
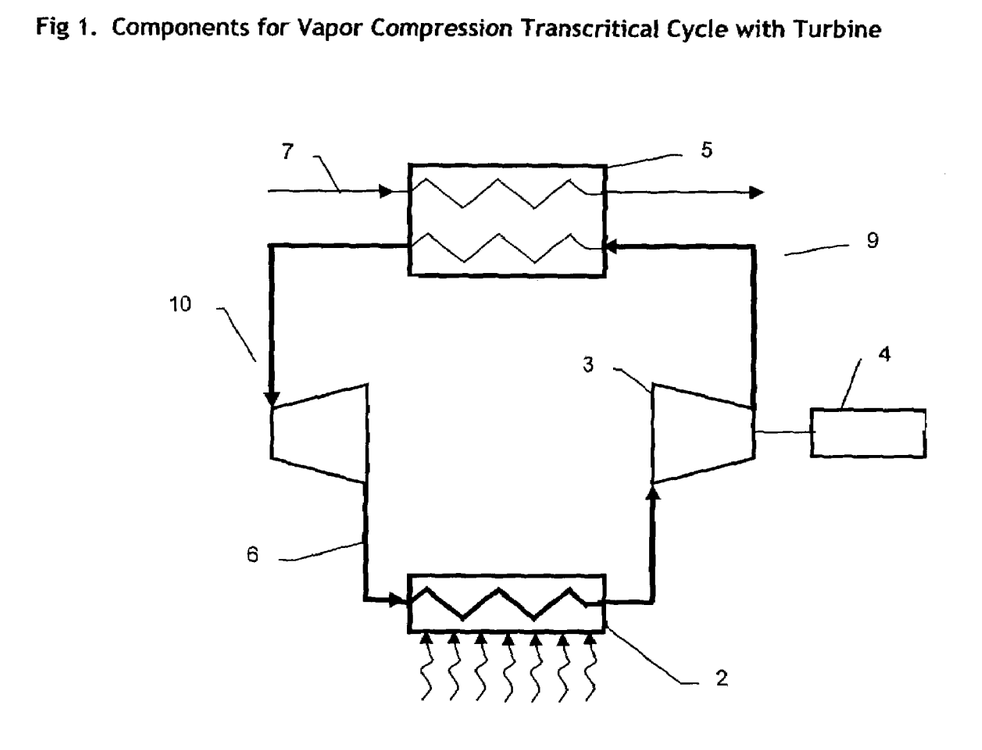
FIG. 1 is a schematic representation of the transcritical vapor compression cycle of the invention

FIG. 1 depicts the components of a microrefrigeration system 1. The dimensions of system 1 are such that the entire integrated package does not exceed 10 $cm^3$ per Watt of required heat dissipation, and which requires less than 100 Watts of power consumption. Working fluid circulating through a closed channel 6 exits the heat absorber and enters the suction of a low voltage compressor 3 which is driven by motor 4 and which can receive supplementary power by coupling 11, although the use of said coupling is not a requirement of the invention. The fluid then moves in similar manner as in the standard cycle, through heat rejecter 5. The working fluid exits the heat rejecter and enters the turbine 10, where it undergoes expansion to the lower pressure of the heat accepter.

The components shown in FIG. 1 are all connected in a closed loop of recirculating working fluid. In normal operation, working fluid is neither added nor removed from the system. The closed-loop channels of this invention conduct the working between and through the components. At different points in the Loop, these channels may take the form of small pipes or tubing, passageways built into the casing or active components of the integrated device, some of these passageways being in the form of capped microchannel troughs that have been formed in any process typical of micro-mechanical technology, such as etching or laser cutting.

Figure 2:
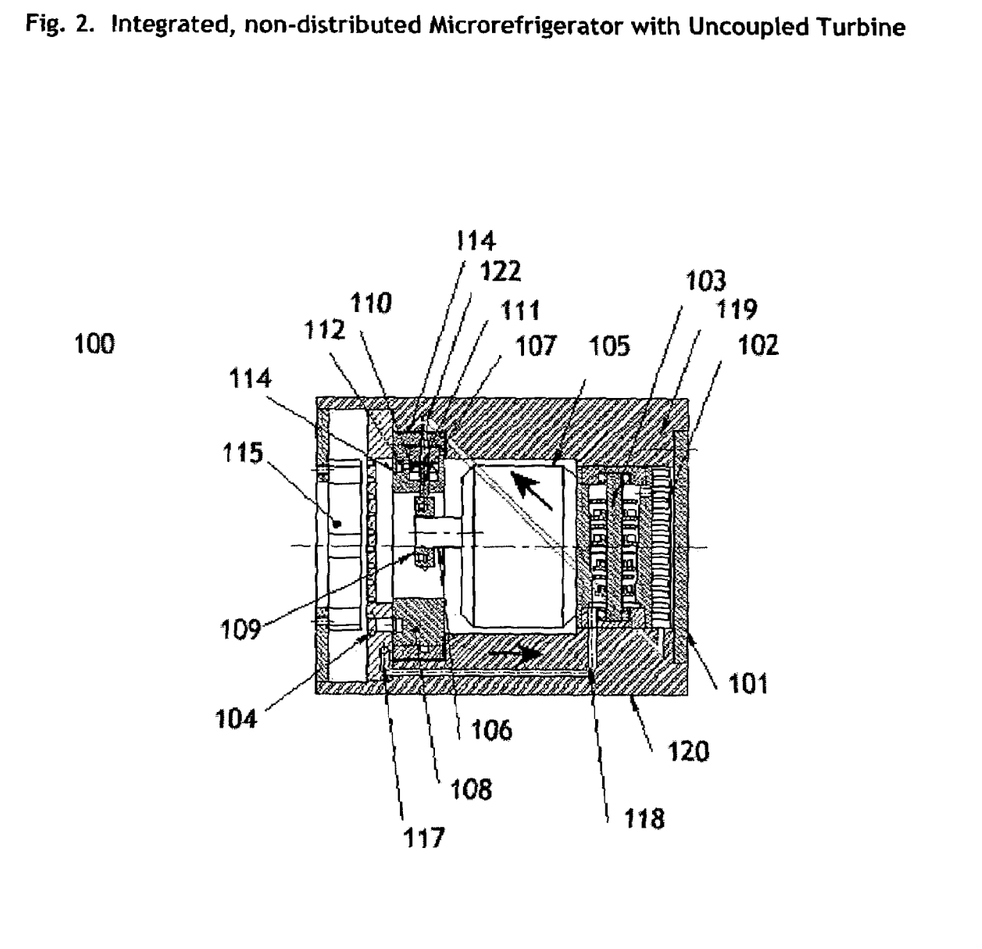
FIG. 2 is a cross-sectional diagram of an integrated microrefrigerator having a turbine expander that is not coupled to the compressor

FIG. 2 provides a drawing of the present invention in one embodiment for refrigerating a target device that has an integrated circuit. As detailed and labeled in the diagram, the apparatus is comprised of a reciprocating compressor, heat exchangers for condensing and evaporating, and a turbine in a closed loop with all components connected. All components of the apparatus are encased to form a single unit package. A regulating means is provided, which consists of sensors for operating variables, control logic, and actuators for altering the operating variables. Power to said apparatus may be derived from the public net of the target device or from an independent source.

The microrefrigeration apparatus 100 as shown in FIG. 2 attaches to the packaging of the integrated circuit and is oriented in such a way that the integral cold plate 101 is in close proximity to and preferably in contact with the packaging of the integrated circuit. Insulation may also surround parts of the apparatus and packaging. The evaporating heat exchanger 102 of the system faces downward toward said packaging of the target device, just above the cold plate 101 and is directly above or in contact with the cold plate. In another preferred embodiment, the cold plate and evaporating heat exchanger may be one and the same.

Just above the evaporator 102, is the turbine expander 103. According to the present invention, a turbine may be used for throttling. Throttling provides an additional parameter to control working fluid characteristics within the vapor compression cycle. A typical method of throttling is through an orifice. Any method of throttling embodied in a device would be incorporated in the vapor compression cycle at the same place as an orifice in a standard cycle, said place being between the condenser 104 and the turbine 103.

The turbine 103 as shown in the drawing is not coupled to the compressor. The turbine shaft is instead positioned perpendicular to the motor axis. The turbine directs working fluid immediately into the evaporator 102. Upon exiting the evaporator, working fluid enters into a channel that connects to the compressor inlet 122. This channel is situated inside the microrefrigerator casing 120 and runs diagonally across the body.

Throttling can be achieved by applying braking force (brake not shown in FIG. 2) to the turbine shaft, so as to control the mass flow rate of working fluid undergoing expansion within the turbine. The turbine in said orientation may be of either an impulse or reaction design. Combining said natural working fluid and said means of throttle control may extend expansion of the working fluid beyond isenthalpic to isentropic expansion. Such additional expansion enables the apparatus to achieve both greater cooling capacity and greater energy efficiency.

The motor 105 is positioned with its center axis coinciding with the axis of the enclosure. The motor shaft 106 rotates eccentrically about the motor axis to provide a reciprocating movement to the array of compressor heads 108. The compressor forms a ring that is centered on the axis of the enclosure and within which the eccentric motor shaft rotates together with the shaft bearing 109. Responding to the reciprocating action of the piston 107, a compressor diaphragm 110 alternately draws working fluid in during the piston downstroke, whereupon the compressor inlet check valve 111 closes during the piston upstroke to compress the working fluid and to drive it toward the condenser 104 via the compressor outlet check valve 112. An outer ring 113 encases the compressor head assembly.

Fluid expelled from the compressor enters the condenser via the outlet ring 114. The condenser is positioned in proximity to the fan 115 and exchanges heat indirectly with an ambient media, which is preferably air, passing countercurrently across the elements of the condenser. It should be emphasized that the use of the term "condenser" is colloquial, and that in normal operation no actual condensing occurs. Instead, the working fluid is maintained in a supercritical state throughout its passage inside the condenser. Air that has passed through the condenser enters a plenum 106, and exits through vents on the can 120 surface. Thus, the condensing heat exchanger faces away from said packaging. The fan is positioned on top of the condensing heat exchanger and is used to expel heat from the closed loop. Working fluid flows to the condenser outlet 117 and immediately flows to the turbine inlet 118, whereupon the cycle begins anew. Expanded working fluid flows into the evaporator 102, where it picks up heat from the cold plate, and then exits via evaporator outlet 119 and then on to the compressor. In order to circumvent the turbine and motor, the compressor feed line is built inside the casing 120 in a diagonal direction over the motor.

As would be expected by anyone skilled in the art, various means of control are built into the microrefrigerator in order to maintain proper temperature and pressure. For example, the pressure in the condenser is controlled by adjusting the braking force on the turbine shaft, or by adjusting the speed or outlet pressure of the compressor, or by a combination of these controls. Temperature monitors on the evaporator and condenser also serve to control pressure and flow conditions within the system. Such means of control sensors and actuators are not depicted on the diagrams but are included. Logic systems may be incorporated into the electronics of the target device.

Figure 3:
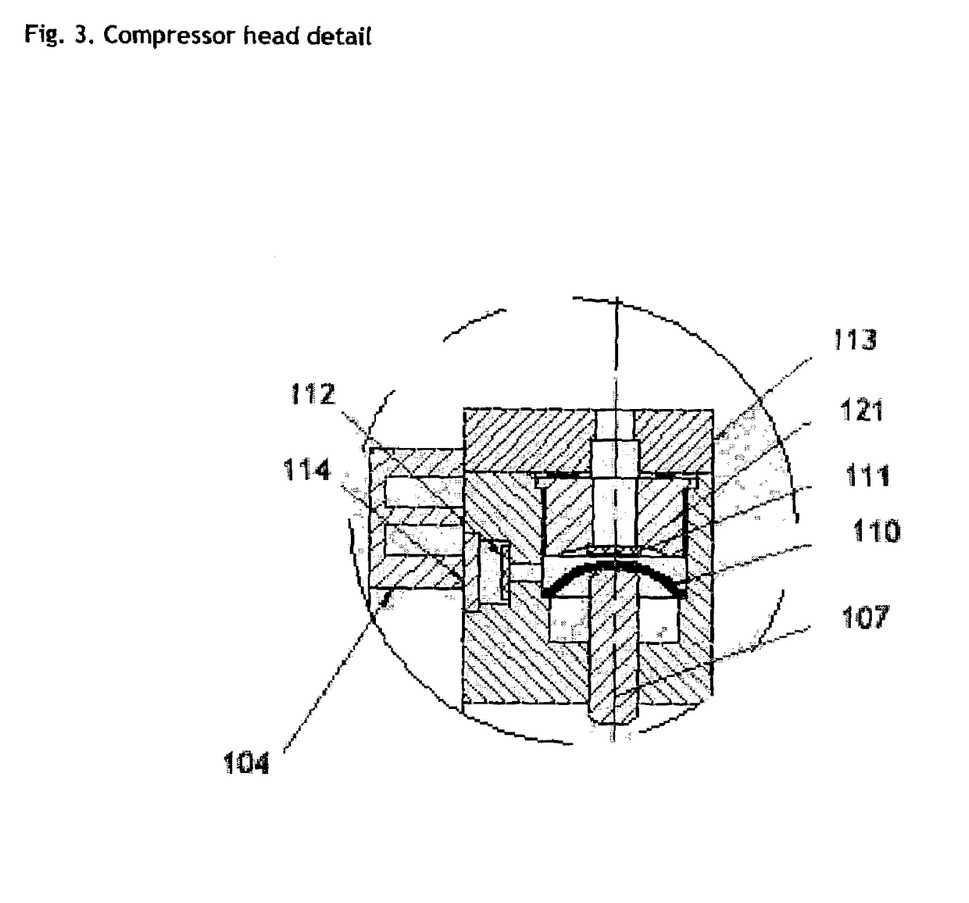
FIG. 3 is a detail of one of the compressors shown in FIG. 2

FIG. 3 presents a detail of the compressor head 108. The piston 107 is shown driving upward against the diaphragm 110. During the upward stroke, the inlet check valve 111 is closed while the outlet check valve 112 is open. This forces working fluid past the outlet ring 114 and into the condenser 104. During the downward stroke, the inlet valve 111 opens and the outlet valve 112 closes, and working fluid is drawn into the compressor.

Figure 4:
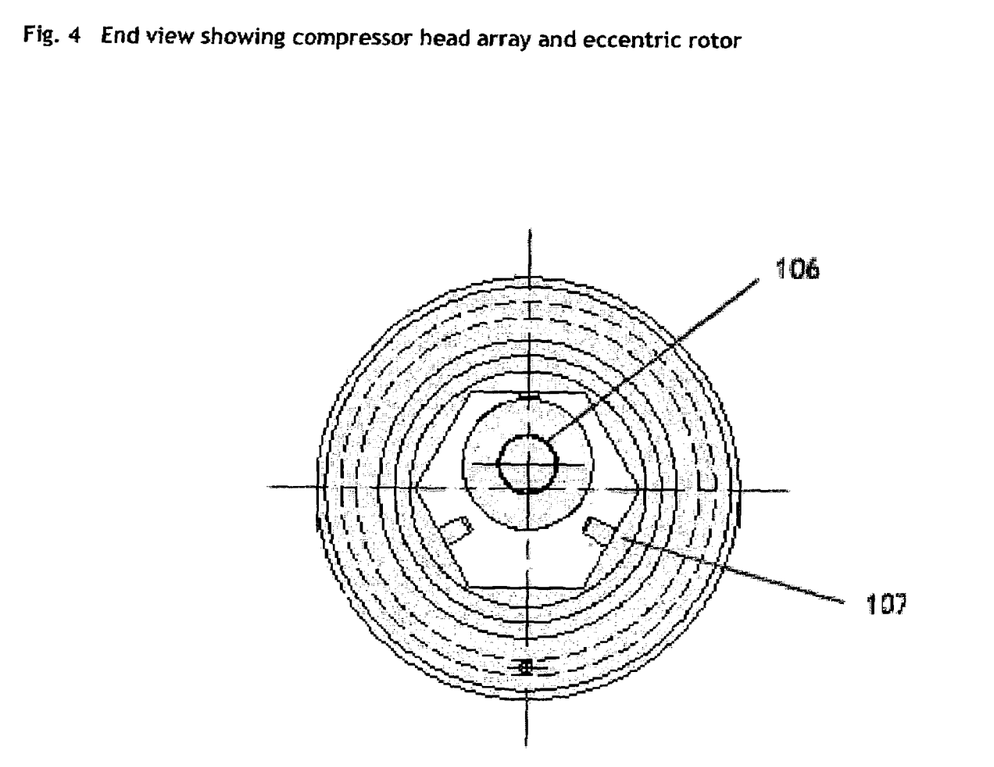
FIG. 4 is a side detail of the microrefrigerator represented in FIG. 2, showing the array of three compressors about the central axis

There are three compressor heads arranged in a ring, as shown in FIG. 4. As the eccentric motor shaft 106 rotates, it pushes in the compressor pistons in sequence. Working fluid is forced into the outlet ring 114, which is continuous around the circumference of the microrefrigerator. From the outlet ring, fluid enters the condenser 104.

Figure 5:
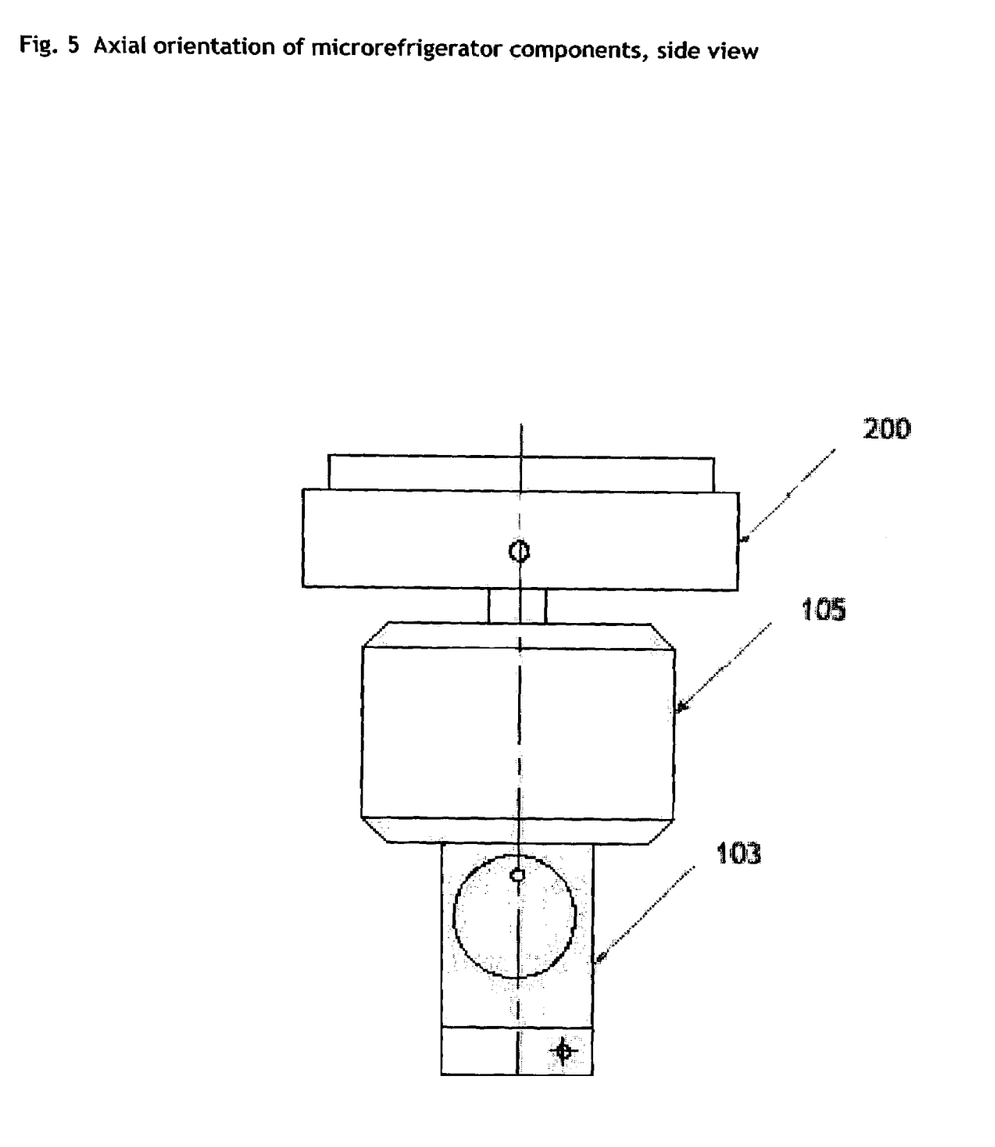
FIG. 5 is a side detail of FIG. 2, showing the orientation of the turbine to the motor

FIG. 5 represents the axial array of the main components in side view, which is shifted 90° from the views presented in FIGS. 2–4. This view emphasizes the orientation of the turbine, whose axis is perpendicular to the axis of the motor.

Figure 6:
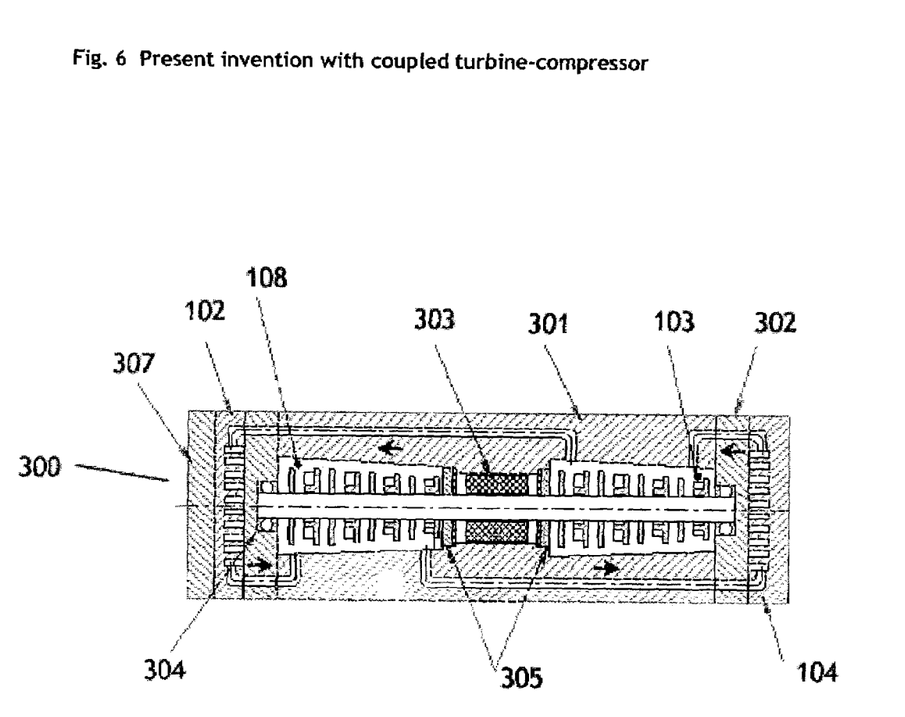
FIG. 6 is a diagram of an integrated microrefrigerator having a turbine expander that is coupled to the compressor

FIG. 6 represents an alternative embodiment of the present invention, in which the turbine is coupled to the compressor by the motor shaft. This version is hereinafter referred to as the coupled microrefrigerator 300. This device is contained within a casing 301. The bottom side 306 of the casing consists of the cold plate 101 on the outside and the evaporator 102 just within. End covers 302 protect the lateral sides. The top side 307 is vented to expose the condenser 104. Working fluid traverses the system through the casing in a manner similar to the above mentioned uncoupled system 1: From the evaporator outlet, fluid enters the compressor, then goes to the condenser, and from there to the turbine expander, which expels fluid to the evaporator to complete the cycle. In the coupled microrefrigerator 300, the compressor 108 and turbine 103 are arranged in direct opposition, with the motor 303 in between. The complete compressor-motor-turbine assembly is supported by bearings 304. Shaft seals 305 prevent working fluid from short-circuiting either the condenser or the evaporator. In operation, useful work produced at the turbine shaft supplements the work supplied by the motor to the compressor.

In another preferred embodiment, there is an additional heat exchanger beyond the two or more within the single unit packaging of the apparatus. Said heat exchanger is external to the apparatus but still connected to the loop of the components within the single apparatus package. Piping connects said external heat exchanger to the components within the apparatus packaging, providing a means for working fluid to flow between said heat exchanger and apparatus. As with the embodiment as shown in FIG. 2, the package of the apparatus attaches to the packaging of the target device. Insulation may also surround parts of the apparatus and packaging. Said external heat exchanger is integrated or inserted into the packaging of the target device, and preferably contacted with it, for evaporating. The condensing heat exchanger faces away from the target device packaging. A fan on top of the condensing heat exchanger is used to expel heat from the closed loop.

Another preferred embodiment of the present invention includes an insertion of one or more intercoolers. An intercooler exchanges heat indirectly between the working fluid exiting the condenser and the working fluid exiting the heat exchanger heat transfers heat from the target device to the working fluid. Such an exchange adds heat to the vapor going to the suction of the compressor and thus reduces the load on the compressor.

In yet another preferred embodiment of the present invention, a separator is included between heat exchangers to separate gas and liquid. A separator helps to feed the compressor a gaseous working fluid and the heat exchanger that transfers heat from the target to device to the working fluid with an enhanced amount of liquid working fluid.

Another preferred embodiment of the present invention includes an ejector. In addition to use as a means of throttling, an ejector enhances efficiency by creating a vacuum effect prior to entering the heat exchanger that transfers heat from the target to device to the working fluid.

Examples of improvements to the Coefficient of Performance (COP) of the cycle by practicing the embodiments of the present invention are presented in Table 1. As can be seen in Table 1, either an intercooler or a turbine improve the COP, but a turbine improves COP to a greater degree.

Example 1. The COP of a cycle operating with a turbine in place of a throttling valve, without an intercooler, rises 28%, from 2.12 to 2.93, at constant evaporator temperature of 5° C.

Example 2. The COP of a cycle operating with a turbine and no intercooler can be improved more than two times, from 2.93 to 6.15, by allowing the temperature at the evaporator inlet (or turbine outlet) to rise from 5° C. to 25° C.

TABLE 1

Refrigeration Performance by Cycle Type

| Cycle description | Evaporator | | Condenser Outlet | | COP |
|---|---|---|---|---|---|
| | ° C. | Bar | ° C. | Bar | |
| Throttling valve | 5 | 39 | 40 | 98.6 | 2.12 |
| Intercooler and throttling valve | 5 | 39 | 40 | 98.6 | 2.26 |
| Turbine in place of throttling valve, no intercooler | 5 | 39 | 40 | 98.6 | 2.93 |
| Turbine in place of throttling valve, no intercooler | 30 | 71 | 50 | 103.6 | 1.04 |
| Turbine in place of throttling valve, no intercooler | 25 | 63.5 | 50 | 98.6 | 2.07 |

TABLE 1-continued

Refrigeration Performance by Cycle Type

| Cycle description | Evaporator °C. | Bar | Condenser Outlet °C. | Bar | COP |
|---|---|---|---|---|---|
| Turbine in place of throttling valve, no intercooler | 18 | 53.9 | 40 | 98.6 | 4.56 |
| Turbine in place of throttling valve, no intercooler | 25 | 63.5 | 40 | 98.6 | 6.15 |

TABLE 2

Annotation of Drawings

| | |
|---|---|
| 1 | Cycle components |
| 2 | Heat accepter |
| 3 | Compressor |
| 4 | Motor |
| 5 | Heat rejecter |
| 6 | Working fluid |
| 7 | Ambient fluid |
| 10 | Turbine |
| 11 | Coupling shaft (optional) |
| 100 | Microrefrigerator |
| 101 | Cold plate |
| 102 | Evaporator |
| 103 | Turbine |
| 104 | Condenser |
| 105 | Motor |
| 106 | Eccentric shaft |
| 107 | Piston |
| 108 | Compressor head |
| 109 | Bearing |
| 110 | Diaphragm |
| 111 | Inlet check valve |
| 112 | Outlet check vavle |
| 113 | Outer ring |
| 114 | Outlet ring |
| 115 | Fan |
| 116 | Condenser plenum |
| 117 | Condenser outlet |
| 118 | Turbine inlet |
| 119 | Evaporator outlet |
| 120 | Casing, or can |
| 121 | Compressor insert |
| 122 | Compressor inlet |
| 200 | Inner body |
| 300 | Coupled microrefrigerator |
| 301 | Coupled casing |
| 302 | Coupled end cover |
| 303 | Coupled motor |
| 304 | Coupled bearings, single shaft |
| 305 | Coupled shaft seals |
| 306 | Casing bottom side |
| 307 | Cold plate |

REFERENCES CITED

U.S. PATENT DOCUMENTS

| | | | |
|---|---|---|---|
| 5,653,285 | Aug. 5, 1997 | Lee | 165/185 |
| 6,148,635 | Nov. 21, 2000 | Beebe et al. | 62/498 |
| 6,310,773 | Oct. 30, 2001 | Yusuf et al. | 361/704 |
| 6,400,012 | Jun. 4, 2002 | Miller et al. | 257/712 |
| 6,407,916 | Jun. 18, 2002 | Konstad | 361/687 |
| 6,434,955 | Aug. 20, 2002 | Ng et al. | 62/106 |
| 6,438,984 | Aug. 27, 2002 | Novotny et al. | 62/259.2 |
| 6,457,515 | Oct. 1, 2002 | Vafai et al. | 165/80.4 |
| 6,497,110 | Jan. 24, 2002 | Davidson et al. | 62/259.2 |
| 6,498,725 | Jan. 24, 2003 | Cole et al. | 361/700 |
| 6,502,419 | Jan. 7, 2003 | Pfister et al. | 62/497 |

OTHER PUBLICATIONS

We claim:

1. An apparatus for microrefrigeration employing a vapor compression cycle comprising:
   (a) a natural and environmentally benign working fluid in a transcritical cycle;
   (b) a compressor means to compress the working fluid;
   (c) at least one heat exchanger for transferring heat from the working fluid to an external environment;
   (d) at least one heat exchanger for transferring heat from a target device to the working fluid;
   (e) a throttling means to expand said working fluid;
   (f) a closed loop connecting said compressor, said heat exchangers and said throttling means for circulation of the working fluid in a transcritical cycle;
   (g) said apparatus not exceeding 10 cm$^3$/Watt of microrefrigeration when consuming 100 Watts or less.

2. The apparatus as recited in claim 1, wherein the natural and environmentally benign working fluid is at least one selected from a group consisting of carbon dioxide, water, and natural hydrocarbon.

3. The apparatus as recited in claim 1, wherein the compressor is of reciprocating type.

4. The apparatus as recited in claim 1, wherein the compressor is of centrifugal type.

5. The apparatus as recited in claim 1, wherein the compressor is of low voltage.

6. The apparatus as recited in claim 1, wherein at least one heat exchanger is of microchannel type.

7. The apparatus as recited in claim 6, wherein the microchannel has an ovoid cross-sectional geometry.

8. The apparatus as recited in claim 6, wherein the microchannel has a polygonal cross-sectional geometry.

9. The apparatus as recited in claim 1, wherein the throttling means is included between two heat exchangers.

10. The apparatus as recited in claim 9, wherein the throttling means is a turbine.

11. The apparatus as recited in claim 10, wherein the turbine is of impulse type.

12. The apparatus as recited in claim 10, wherein the turbine is of reaction type.

13. The apparatus as recited in claim 9, wherein the turbine produces useful work.

14. The apparatus as recited in claim 13, wherein the turbine is energetically coupled with the compressor to recover energy.

15. The apparatus as recited in claim 13 or claim 14, with increased cooling capacity.

16. The apparatus as recited in claim 13 or claim 14, with increased energy efficiency.

17. The apparatus as recited in claim 1, wherein the natural and environmentally benign working fluid is oil-free.

18. The apparatus as recited in claim 1, with an addition of one or more intercoolers to transfer useful work from the high pressure side to the low pressure side.

19. The apparatus as recited in claim 1, with an addition of one or more separators to separate gas and liquid.

20. The apparatus as recited in claim 1, with an addition of an ejector for throttling.

21. The apparatus as recited in claim 20, wherein the ejector is included between two heat exchangers.

22. The apparatus as recited in any one of claims 18 through 21, wherein said addition increases the efficiency of the cycle.

23. The apparatus as recited in claim 1, wherein the compressor means, throttling means or a combination thereof are regulated by a regulating means.

24. The apparatus as recited in claim 1, wherein sensors monitor and control temperature and temperature-related phenomena.

25. The apparatus as recited in claim 1, wherein the apparatus derives power from a target device's public power network.

26. The apparatus as recited in claim 1, wherein the apparatus derives power from an independent source.

27. The apparatus as recited in claim 1, wherein insulation avoids external condensation on the apparatus.

28. The apparatus as recited in claim 1, wherein insulation avoids external condensation on the target device.

29. The apparatus as recited in claim 1, wherein one or more of the heat exchangers are external.

30. The apparatus as recited in claim 29, wherein the heat exchangers transfer heat from the target device to the working fluid.

31. The apparatus as recited in claim 29, wherein the heat exchangers are included in the closed loop.

32. The apparatus as recited in any one of claims 29 through 31, wherein the heat exchangers are inserted into a packaging of components of the target device.

33. The apparatus as recited in any one of claims 29 through 32, wherein the heat exchangers are in contact with components of the target device.

34. The apparatus as recited in any one of claims 29 through 33, wherein the heat exchangers are in direct contact with components of the target device.

35. A method for microrefrigeration of a target device, employing a vapor compression cycle comprising:
 (a) using a natural and environmentally benign working fluid;
 (b) compressing the working fluid;
 (c) transferring heat from the working fluid to an external environment using at least one heat exchanger;
 (d) expanding the working fluid;
 (e) transferring heat from another external environment to the working fluid using at least one heat exchanger;
 (f) connecting components (a) through (e) in a closed loop;
 (g) circulating said working fluid in said loop through a cycle involving supercritical high pressure and subcritical low pressure conditions;
 (h) refrigerating said another external environment, and
 (i) providing a maximum of 10 $cm^3$/Watt of microrefrigeration when consuming 100 Watts or less.

36. The method as recited in claim 35, wherein the natural and environmentally benign working fluid is at least one selected from a group consisting of carbon dioxide, water, and natural hydrocarbon.

37. The method as recited in claim 35, wherein the target device is selected from a group consisting of electrical, electronic, optical or portable devices and devices and components having at least an integrated circuit or embedded control.

38. The method as recited in claim 35, wherein compressing the working fluid is accomplished by a compressor.

39. The method as recited in claim 35, wherein expanding the working fluid is accomplished by a turbine.

40. The method as recited in claim 38, wherein the compressor is of reciprocating type.

41. The method as recited in claim 38, wherein the compressor is of centrifugal type.

42. The method as recited in claim 39, wherein the turbine is of impulse type.

43. The method as recited in claim 39, wherein the turbine is of reaction type.

44. The method as recited in claim 39, wherein the turbine produces useful work.

45. The method as recited in claim 44, wherein the turbine is energetically coupled with the compressor to recover energy.

46. The methods as recited in any one of claims 35 through 45, wherein expanding said working fluid insentropically increases cooling capacity.

47. The methods as recited in any one of claims 35 through 45, wherein expanding isentropically increases efficiency.

48. The method as recited in claim 35, wherein one or more intercoolers are used to transfer useful heat from a high pressure side and to a low pressure side.

49. The method as recited in claim 35, wherein one or more separators are used to separate gas and liquid.

50. The method as recited in claim 35, wherein a combination of intercoolers and separators are used to transfer useful work from the high pressure side to the low pressure side and to separate gas and liquid.

51. The method as recited in claim 35, wherein the oil-free working fluid increases the efficiency of the cycle.

* * * * *